United States Patent
Barlow

(10) Patent No.: US 8,806,743 B2
(45) Date of Patent: Aug. 19, 2014

(54) PANELIZED PROCESS FOR SMT SENSOR DEVICES

(75) Inventor: Arthur Barlow, Four Marks (GB)

(73) Assignee: Excelitas Technologies Singapore Pte. Ltd, Singapore (SG)

(*) Notice: Subject to any disclaimer, the term of this patent is extended or adjusted under 35 U.S.C. 154(b) by 163 days.

(21) Appl. No.: 13/568,407

(22) Filed: Aug. 7, 2012

(65) Prior Publication Data

US 2014/0041214 A1     Feb. 13, 2014

(51) Int. Cl.
*H05K 3/30*     (2006.01)

(52) U.S. Cl.
USPC .............................................. 29/841; 29/428

(58) Field of Classification Search
USPC ........ 29/841, 428, 888.3; 73/272 R; 250/239; 257/433, 434, 676
See application file for complete search history.

(56) References Cited

U.S. PATENT DOCUMENTS

| | | | |
|---|---|---|---|
| 6,545,332 B2* | 4/2003 | Huang | 257/433 |
| 6,734,419 B1* | 5/2004 | Glenn et al. | 250/239 |
| 2007/0223913 A1 | 9/2007 | Lee | |
| 2007/0236596 A1 | 10/2007 | Sekine | |
| 2012/0186338 A1* | 7/2012 | Bonnat | 73/272 R |

FOREIGN PATENT DOCUMENTS

| | | |
|---|---|---|
| EP | 0450713 A1 | 10/1991 |
| GB | 1146223 A | 3/1969 |
| WO | 2004102139 A1 | 11/2004 |

* cited by examiner

*Primary Examiner* — Thiem Phan
(74) *Attorney, Agent, or Firm* — Peter A. Nieves; Sheehan Phinney Bass + Green PA

(57) ABSTRACT

A method is presented for forming multiple surface mount technology (SMT) sensor packages in a panel for separation into individual SMT sensor packages. A base plate is mapped as a grid of sensor footprints, and each footprint is populated with electronic and sensor components. A cover plate including window elements is mapped to a similar grid. The cover plate is bonded to the base plate, such that the window elements are positioned to allow incident electromagnetic radiation upon corresponding sensors mounted on the printed circuit board. Each sensor footprint is sealed within a recess or cell beneath the cover. The sensor circuits may be tested before and/or after being separated into individual SMT sensor packages.

12 Claims, 8 Drawing Sheets

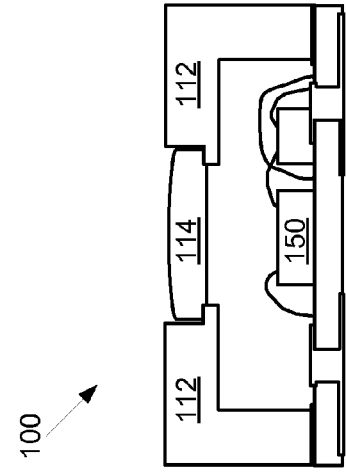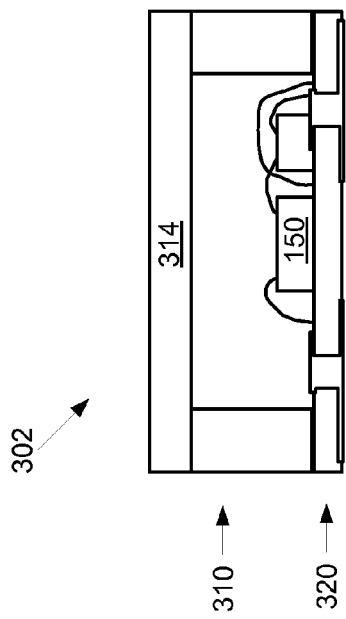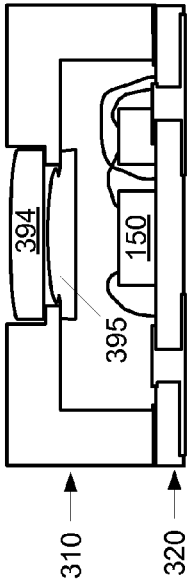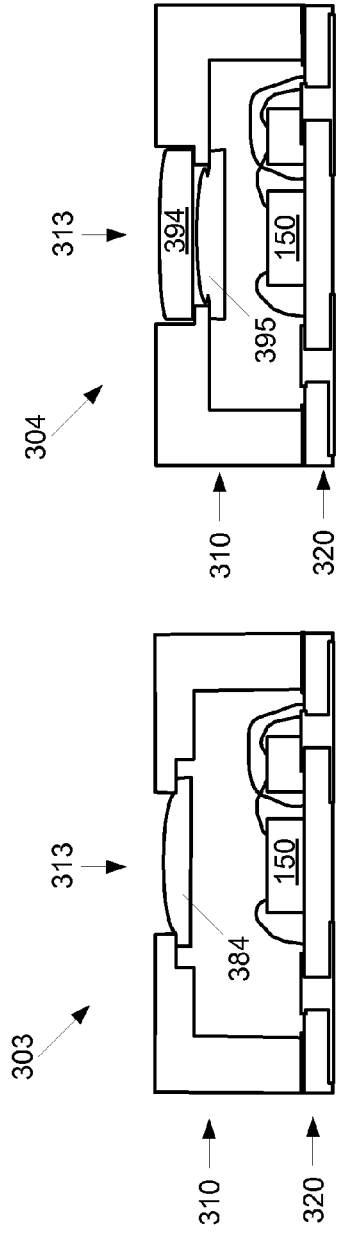

Load the press: Vacuum holds PCB up into upper half of press. Heavier metal/ceramic/plastic plate on lower half of press.
810

Close the press. Purge the entire area with dry N2, while heating to 165 C, 1-2 minutes.
820

Form the ITS seal: Release vacuum, Wait "pressure on time", then turn off the purge, and activate Piston to press PCB onto plate.
830

Cure
Continue heating to 165 C to cure the Bonding agent
840

Open the machine:
Finished article, panel of parts, all sealed iso-thermally, each N2 filled. Ready for testing and sawing
850

FIG. 8

PANELIZED PROCESS FOR SMT SENSOR DEVICES

FIELD OF THE INVENTION

The present invention relates to semiconductor devices, and more particularly, is related to a process for producing SMT sensor devices.

BACKGROUND OF THE INVENTION

Sensors are used for detecting electromagnetic radiation such as heat radiation or infrared radiation. Motion detectors detect, for example, persons, by detecting the heat radiation emitted by the persons. Temperature detectors may be used to determine the temperature of an object, and photo detectors may detect the amount of incident light being directed toward a sensor element.

Surface mount technology (SMT) is used for constructing electronic circuits where the components (surface-mounted components/SMCs) are mounted directly onto the surface of printed circuit boards (PCBs). An electronic device so made is called a surface mount device (SMD). SMT has largely replaced the through-hole technology construction method of fitting components with wire leads into holes in the circuit board.

An SMT component is usually smaller than its through-hole counterpart because it has either smaller leads or no leads at all. It may have short pins or leads of various styles, flat contacts, a matrix of solder balls (BGAs), or terminations on the body of the component.

An SMT sensor package may contain a lid or cover portion bonded to a base, where the circuit components are attached to the base. The cover portion and/or the base may each be so designed to form a cavity region above the base, and the cavity region may be substantially sealed, such that a vacuum or quasi-vacuum is within the cavity, for example, to protect the circuit from contaminants or particles that may interfere with the operation of sensor components. The cavity may similarly be filled with a gas, for example, an inert gas. The cover generally includes a transparent area or window configured to permit transmission of some forms of electromagnetic radiation. The window may perform additional functions, for example, filtering certain wavelengths, or focusing, shaping or diverting electromagnetic radiation using, for example, one or more lenses. The window may also perform a combination of these functions, for example, both filtering and focusing or diverting functions.

An exemplary apparatus and process for iso-thermally sealing electronic packages with a thermosetting adhesive is disclosed by the European Patent Application 91200724.2, entitled "Iso-thermal seal process for electronic devices," is incorporated by reference herein in its entirety.

Manufacturing costs for SMT sensor packages may be high relative to other electronic components due to complexities in constructing and assembling the components described above. Therefore, there is a need in the industry to manufacture SMT sensor packages at a lower cost.

SUMMARY OF THE INVENTION

Embodiments of the present invention provide methods for producing panelized SMT sensor packages. Briefly described, the present invention is directed to a process for manufacturing a surface mount technology (SMT) sensor device, including the steps of forming a support substrate, mapping a grid having a plurality of sensor footprints on the substrate, affixing a sensor within each the plurality of sensor footprints, forming a lid having a plurality of sensor encapsulating covers having transparent members, wherein the plurality of encapsulating covers are configured to correspond to the plurality of sensor footprints in a one-to-one fashion, aligning the lid to the support substrate, bonding the lid to the support substrate to form a panel, wherein a cavity is formed above each sensor and below each transparent member, and cutting the panel according to the grid to form an SMT sensor device.

A second aspect of the present invention is directed to a process for manufacturing a surface mount technology (SMT) sensor device, including the steps of forming a support substrate, mapping a grid having a plurality of sensor footprints on the substrate, affixing a sensor to each the plurality of sensor footprints, forming a lid having a plurality of sensor encapsulating covers, wherein the plurality of encapsulating covers are configured to correspond to the plurality of sensor footprints in a one-to-one fashion, aligning the lid to the support substrate, bonding the lid to the support substrate to form a panel, wherein a cavity is formed above each sensor and below the lid, and cutting the panel according to the grid to form a of SMT sensor device.

Briefly described, in architecture, a third aspect of the present invention is directed to a method for manufacturing an SMT sensor device in a vacuum press, including the steps of loading a substrate plate having a plurality of sensors and a cover plate into the press, closing the press, sealing the press, purging the press with a gas, heating the press, and pressing the substrate plate against the cover plate, wherein the pressing the substrate plate against the cover plate forms a plurality of cells filled with the gas.

As used herein, a sensor may refer to a thermal sensor, a pyroelectric sensor, a thermopile, or an optical sensor.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

FIGS. 3A-3D are schematic diagrams of exemplary embodiments of SMT sensor packages with variations on the cover.

FIG. 8 is a flowchart of a second exemplary method for forming an SMT sensor package in a vacuum press.

DETAILED DESCRIPTION

Figure 1:
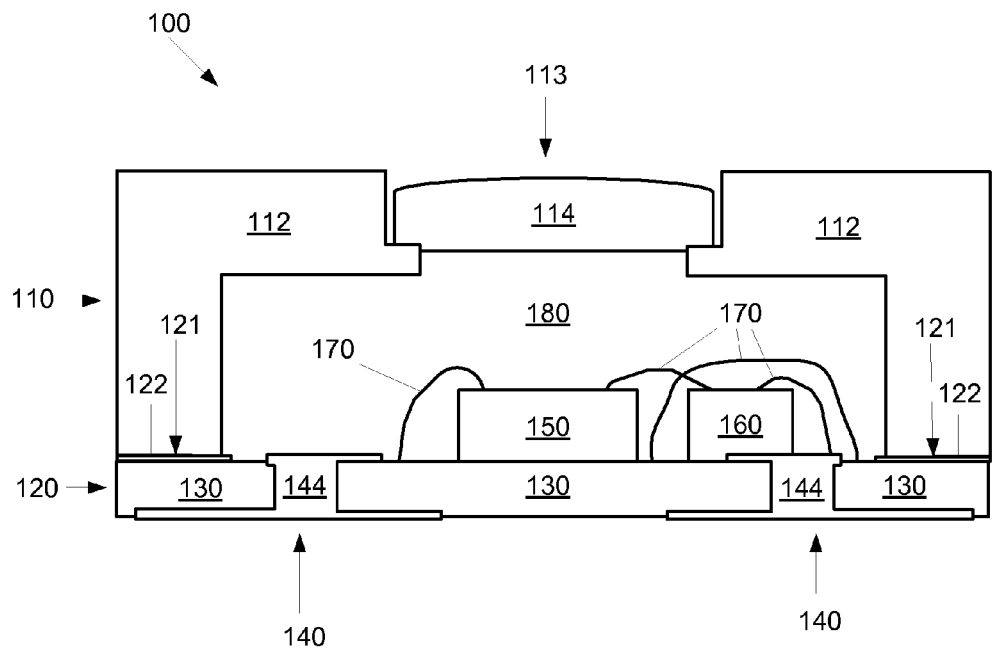
FIG. 1 is a schematic diagram of a first exemplary embodiment of a SMT sensor package.

Reference will now be made in detail to embodiments of the present invention, examples of which are illustrated in the accompanying drawings. Wherever possible, the same reference numbers are used in the drawings and the description to refer to the same or like parts.

Exemplary methods for forming multiple SMT sensor packages in a panel for separation into individual SMT sensor packages are presented. A base plate, for example, a printed circuit board (PCB), is mapped as a grid of sensor footprints, and each footprint is populated with electronic and/or sensor components. A cover plate including window elements such as lenses, filters or transparent areas, is mapped to a similar grid. The cover plate is bonded to the base plate, such that the window elements are positioned to allow incident electromagnetic radiation upon corresponding sensors mounted on the PCB. By design, each panel is made such that each sensor footprint is sealed within a gas-filled recess or cell beneath the cover. Once sealed, each of the sensor circuits may be tested before being separated from the panel into individual SMT sensor packages which reduces device handling difficulties and costs. Additionally and/or alternatively, the sensor circuits may be tested as required after being separated from the panel.

SMT Sensor Package

FIG. 1 shows an exemplary sensor package 100 according to a first embodiment. In general, the package 100 has two major portions, a cover portion 110 and a base portion 120. The base portion 120 includes a substrate 130 that may include one or more vias 140 passing through the substrate 130. The vias 140 generally are blocked by a fill 144, for example, an epoxy fill. The filled vias 140 may be modified by removing some or all of the fill 144 to form "open vias," but each such vent-hole is generally sealed with epoxy first, for example, during the manufacturing process. The substrate 130 may be formed of a rigid material, for example, a ceramic plate or a metal plate. The substrate 130 may be a printed circuit board, or may include a printed circuit board or printed circuit layer or layers. The substrate 130 may be formed of an insulating material, for example, a glass-fiber board, such as FR4. Electronic components may be mounted to the substrate 130, including a sensor 150, for example, an infrared sensor or an optical sensor, and a circuit element 160, for example, an ASIC. Of course, the electronic components mounted to the substrate 130 may vary in number and in form and function, for example, but not limited to, discrete electrical components such as resistors, capacitors, diodes and transistors, or already-packaged integrated circuits or integrated circuit silicon dies. The electrical components may be electrically and/or thermally connected with connecting wires 170, and/or may be electrically and/or thermally connected by connectors formed integrally with and/or upon the substrate 130, for example, traces and/or bonding pads.

The sensor 150 is generally positioned substantially in the center of the base 120, but there is no objection to the sensor 150 being offset from the center of the base 120. Similarly, there is no objection to two, three, four or more sensors 150 mounted to the base 120. The sensors 150 are generally mounted beneath a lens or optical component 114 of the cover 110, with a recess portion 180, or cell, between the optic or lens 114 and the sensor 150. The recess 180 is generally formed between the cover 110 and the base 120. The recess 180 may be sealed, so that a vacuum or quasi-vacuum may be maintained within the recess 180, or a gas may be maintained within the recess 180. The lid 112 is generally formed of a rigid structure to physically protect the base 120, for example, from dust and/or projectiles. For example, the lid 112 may be formed of plastic, glass, metal or ceramic plate, with one or more apertures 113 formed in the lid 112, for example by milling or molding apertures 113 into the lid 110. Thereafter, optics, lenses or windows 114 may fitted into the apertures 113, and attached by means familiar to those having ordinary skill in the art, for example, gluing, pressure fitting, or heat bonding.

The lens 114 is generally positioned somewhere above the sensor 150, such that the radiation to be detected by the sensor, for example, infrared or optical radiation, passes through the lens 114 and through the recess 180 to be incident upon the surface of the sensor 150. The radiation is not restricted in any way in terms of angle of incidence or direction of origin etc.

The cover 110 is attached to the base 120 at a bonding area 121. The bonding area 121 may be covered with, for example, an adhesive 122, such as partly pre-hardened epoxy or another glue, and may have additional characteristics, such as electrical and/or thermal insulation or conductivity characteristics appropriate to the application.

It should be noted that the optic or lens 114 may have optical focussing, shaping and/or radiation shaping characteristics, or the optic may merely function as a window for one or more wavelength ranges of electromagnetic radiation. Similarly, the lens 114 may have filtering capabilities, where the optic 114 may block or filter the transmission of one or more wavelength ranges of electromagnetic radiation.

While the SMT sensor packages 100 are generally described and depicted with a single sensor per package, and a single optic or lens 114 or window per package 100, there is no objection to embodiments with two, three, four or more sensors 150 in a single SMT sensor package 100, and/or two, three, four or more optics or lenses 114 and/or windows in a single SMT sensor package 100. The number of lenses/windows in an SMT sensor package need not correspond one-to-one with the number of sensors in the SMT sensor package. For example, there is no objection to an SMT sensor package 100 with two sensors 150 and four lenses 114. Indeed, there may be SMT sensor packages 100 with no lenses or windows 114, for example when the lid 112 is formed of a material that is substantially transparent to the electromagnetic radiation being detected by the sensor 150 within the recess 180 beneath the lid 112. Furthermore, some of the sensors 150 might have different optic 114 arrangements above them all within the same package 100.

Individually bonding covers 110 to bases 120 for SMT sensor packages 100 may be a labor intensive undertaking, particularly when the recess 180 is sealed. Therefore, it is desirable to form two or more packages during the same manufacturing process. The overall shape of the SMT is generally a rectangular block, however, there are no objections to other form factors, such as cylindrical or trapezoidal each shape being formed when the panel 200 is sawn up into individual sensors 100.

Panel Assembly

Manufacturing efficiencies may be improved by forming multiple SMT sensor packages 100 in parallel. For example, multiple SMT sensor packages 100 may be formed in a panel, with the SMT sensor packages 100 arranged in a grid pattern. Moreover, the plates may be designed so that different variants or models or types of sensor 100 each of the same or different dimensions, can be mixed on the plate according to allocated areas, rows or columns, so that a single sealed panel can result in a variety of finished sensors being made simultaneously.

Figure 2A:
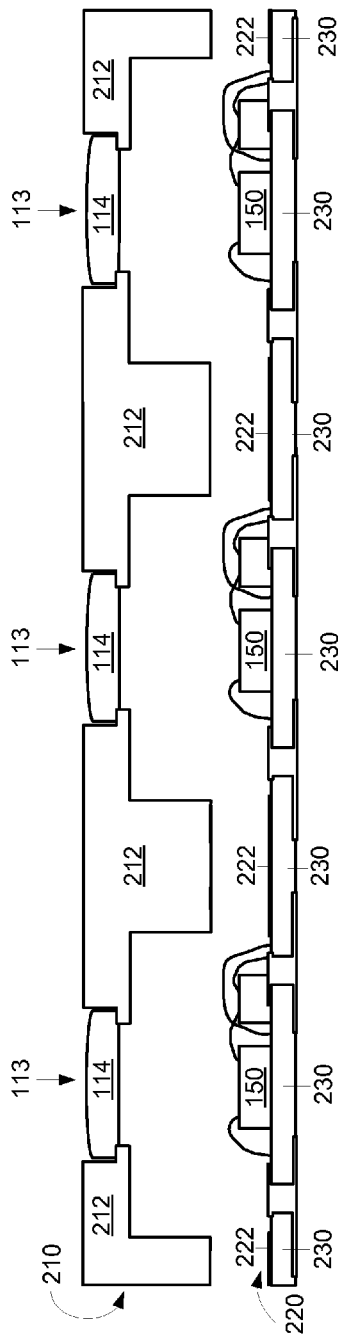
FIG. 2A is a schematic diagram of a row or "panel" of three SMT sensor packages with the lid plate separate from the base plate under the first exemplary embodiment.

FIG. 2A shows a portion of a panel of multiple SMT sensor packages 100 under the first embodiment prior to assembly in two major portions, or plates 210, 220. A cover plate 210 is prepared to be separable into multiple cover portions 110 (FIG. 1), and a base plate 220 is similarly prepared to be separable into multiple base portions 120 (FIG. 2). The cover plate 210 includes a common lid portion 212 with lenses 114 fitted into apertures 113 formed into the common lid portion 212. The base plate 220 includes a common substrate 230, where components for multiple SMT sensor packages 100 (FIG. 2C) are attached. Common bonding areas 222 are positioned on the common base plate 220, for bonding the common base plate 220 with the common cover 210. It should be noted there is no objection to the common bonding areas 222 being covered by glue attached to the common base plate 220 instead of and/or in addition to the common cover plate 210 before it has been attached to a base plate 220.

Figure 2B:
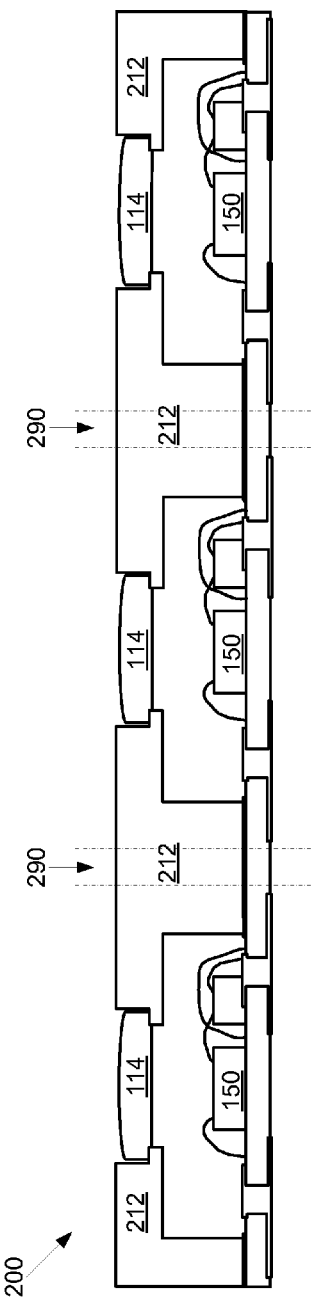
FIG. 2B is a schematic diagram of a row or "panel" of three SMT sensor packages with the lid plate affixed to the base plate under the first exemplary embodiment.
Figure 2C:
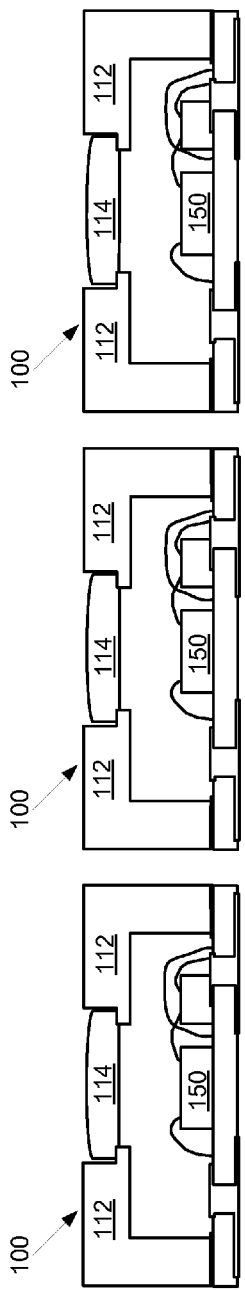
FIG. 2C is a schematic diagram of a row of three SMT sensor packages after separation from their parent panel under the first exemplary embodiment.

FIG. 2B illustrates a sensor panel 200 including multiple individual sensors after bonding the cover plate 210 to the base plate 220 before separation into individual sensors. In general, each optic or lens 114 is positioned above a corresponding sensor 150. A portion of the panel 200 may be removed during the separation process, the removable region 290 depicted between the dashed lines in FIG. 2B.

After the cover plate 210 (FIG. 2A) has been attached to the base plate 220 (FIG. 2A), it may be desirable to test the individual sensor circuits before dividing the sensor panel 200 into individual sensor packages 100 (FIG. 1). For example, the sensor panel 200 may be electrically connected to an external testing system (not shown) that may determine whether each of the individual circuits is functioning within operational tolerances. While this may be accomplished by electrically connecting external circuitry to each of the circuits individually, there is no objection to electrical connectivity between the individual circuits, for example in the removable region 290, that allows multiple circuits to be attached to the external testing system through common electrical connections. If the individual circuits are arranged in a grid pattern for example, a single test electrical connection may be made for each row. Similarly, a single electrical connection could place the external test system in electrical communication with each of the circuits in the sensor panel 200. Of course, such connectivity is severed when the individual packages 100 (FIG. 2C) are separated, and the material from the removable regions 290 is discarded, including any electrical connections between the individual sensor circuits. During testing, any individual circuits that fail may be marked for disposal after the individual packages 100 (FIG. 2C) are separated. Such marking may be, for example, physically marking the package 100, for example, with dye, ink, a stamp or label.

While the above description discusses testing the sensors 150 after the cover plate 210 has been attached to the base plate 220, there is no objection to testing sensors 150 before and/or after the cover plate 210 has been attached to the base plate 220.

FIG. 2C shows individual SMT sensor packages 100 after separation from the sensor panel 200 (FIG. 2B). Note that while for purposes of illustration FIGS. 2A-2C show three sensor circuits, of course, a sensor panel 200 may include any number of sensor circuits and covers, for example, arranged in a row/column grid pattern, or in other such arrangements.

Individual sensor packages 100 may be separated from the sensor panel in several ways familiar to persons having ordinary skill in the art, such as saw cutting, laser dicing, chemical etching or cutting, or other means, and/or a combination of these means. The separation may be performed in a single stage, or may be in multiple stages. For example, the sensor panel 200 (FIG. 2C) may be only partially sawn through in a first stage, so that the final separation may be accomplished by a second cutting or cleaving or breaking stage.

Cover Configuration

The first embodiment of an SMT sensor package 100, reproduced here in FIG. 3B, describes one configuration of an SMT sensor package having a single window and a single sensor. FIG. 3A, and 3C-3D show variations of window and cover configurations in three additional embodiments. FIG. 3A shows a second exemplary embodiment 302, where a window 314 transparent to the radiation wavelengths of interest forms the entire top portion of the cover 310. Such a configuration provides the widest possible field of view for the sensor 150. Under the second embodiment, the remainder of the cover 310 functions as a spacer 312 between the window 314 and the base 320. Under the second embodiment, the cover plate 210 (FIG. 2A) may be configured with the entire top surface formed of a transparent window material, while the remainder of the cover 310 may be non-transparent, for example, metal or ceramic. There is no objection to additional filters, lenses or windows being used in addition to and/or in conjunction with the window 314.

The cover configuration of the first embodiment, shown in FIG. 3B, includes an outside window 114 that may be inserted into the cover from the outside of the cover 110 into recess on top of the cover 110. The recess may be any shape, for example, square or round, on top of a ceramic lid 112, with the window shape corresponding to the shape of the recess. The window 114 may be a lens, window, or filter or combine one or more of these functions. Other optical functions can of course be added or substituted.

FIG. 3C shows a third exemplary embodiment 303 where a bottom fitted window 384 is fitted into a recess 313 in the underside of the cover 310. Like the first embodiment, the recess 313 may be of any suitable shape. Under this configuration, the window 384 may be fitted inside the recess 313 within the package, and may be positioned closer to the sensor chip 150 than a top fitted window. The field of view of the sensor 150 may be more restricted under the third embodiment than under the first embodiment.

FIG. 3D shows a fourth exemplary embodiment 304 having dual lenses, where a bottom fitted first window 395 is fitted into the recess 313 from the underside of the cover 310, and a top fitted second window 394 is fitted into the recess 313 from the top side of the cover 310. The windows 394, 395 may be formed of the same material, or may be formed of different materials serving different functions, for example, a filter to block specific frequencies of electromagnetic radiation from reaching the sensor 150, and a lens to guide and/or focus the electromagnetic radiation. Under the fourth embodiment, the windows 394, 395 are arranged serially, so that electromagnetic radiation passes through both windows 394, 395 to reach the sensor 150.

It should be noted that in general under the third embodiment, the bottom fitted window 384 should be affixed to the cover 310 before attaching the cover to the base 320. Similarly, under the fourth embodiment, the second window 395 should be affixed to the cover 310 before attaching the cover to the base 320. Of course, additional variations are possible, for example, where lenses, filters, and/or windows are further stacked and/or laminated.

Method

Figure 4:
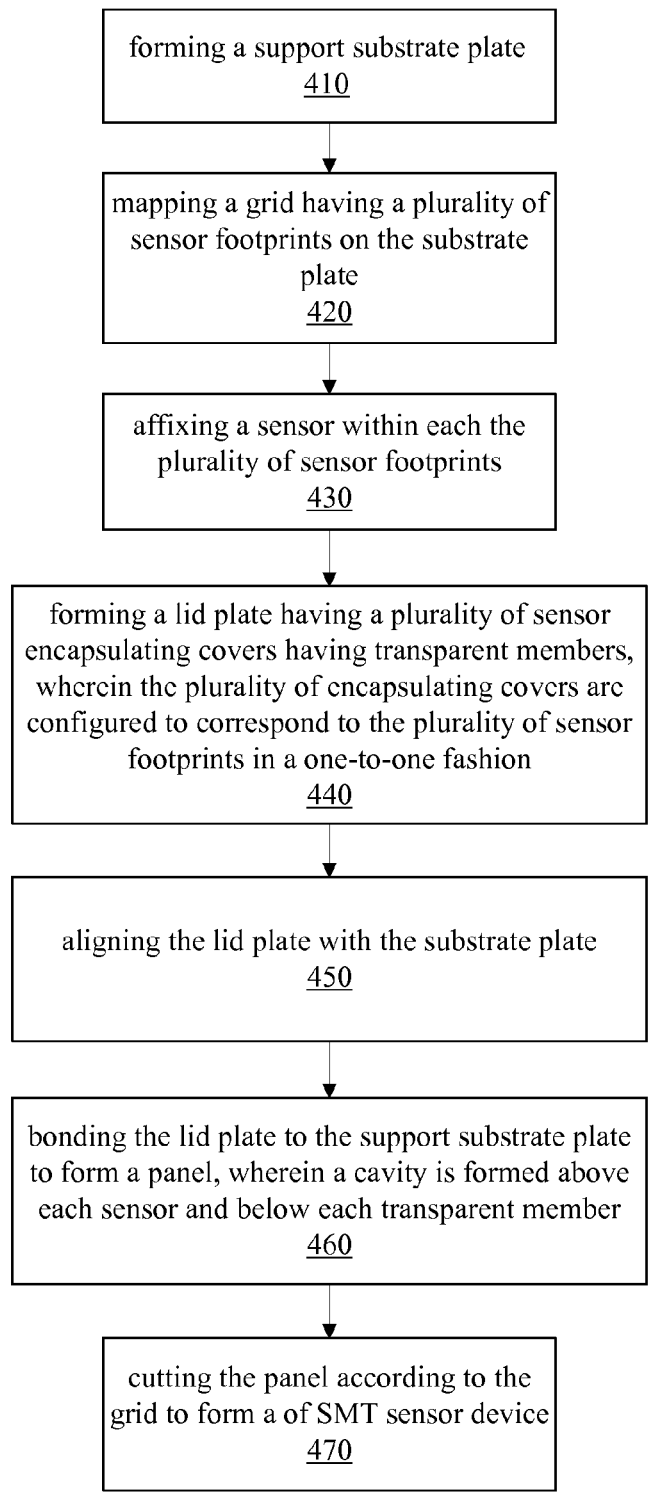
FIG. 4 is a flowchart of a first exemplary method for forming an SMT sensor package.

FIG. 4 is a flowchart of an exemplary method for manufacturing a surface mount technology sensor package. It should be noted that any process descriptions or blocks in flow charts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

Figure 5:
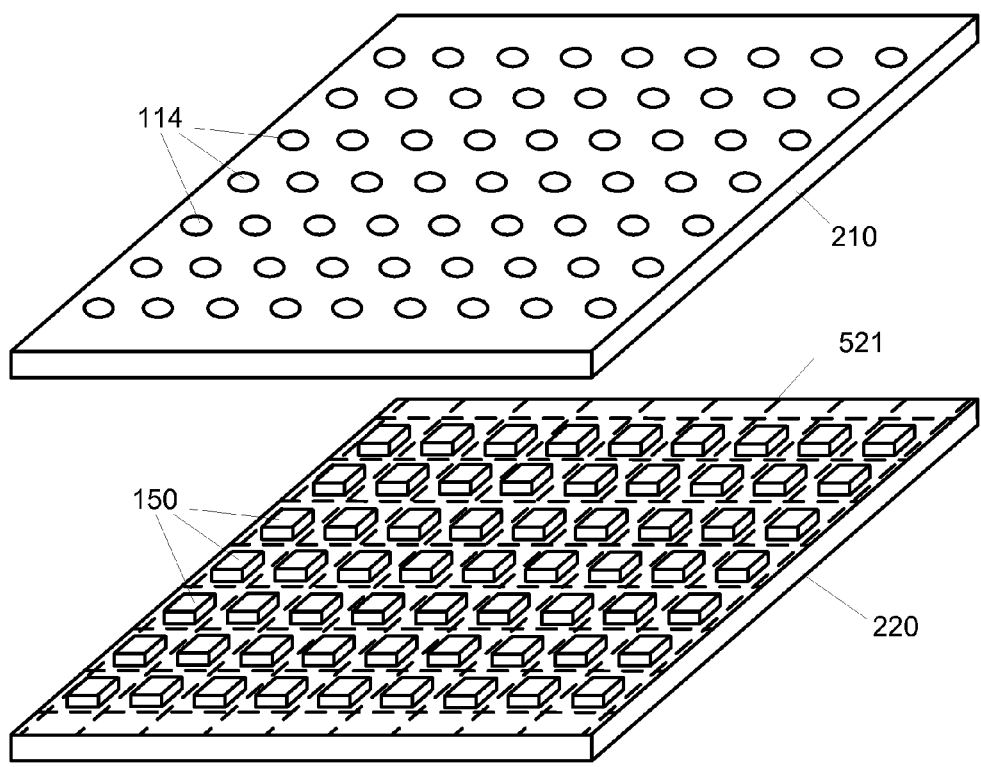
FIG. 5 is a schematic diagram showing a lid plate and a base plate before bonding.

As shown by block 410, a support substrate, or base, is formed. The support substrate may be used both as a physical platform for electrical components such as ASICs and sensor chips, and may include electrical connectivity components, such as a printed circuit board or electrical traces and/or thermal conduits. A step includes mapping a grid having a plurality of sensor footprints on the support substrate, as shown in block 420. A step includes affixing a sensor to each the plurality of sensor footprints, as shown by block 430. The sensor may be a sensor chip or other sensor configuration, and affixing may include both physical attachment and providing electrical connectivity with the sensor. Sensor chips may be affixed individually, or in groups of two or more using automated methods familiar to persons having ordinary skill in the art. FIG. 5 shows a substrate 220 with a mapped grid of sensor footprints and a sensor 150 affixed within each footprint. The grid outlines are shown as dashed lines 521.

Figure 6:
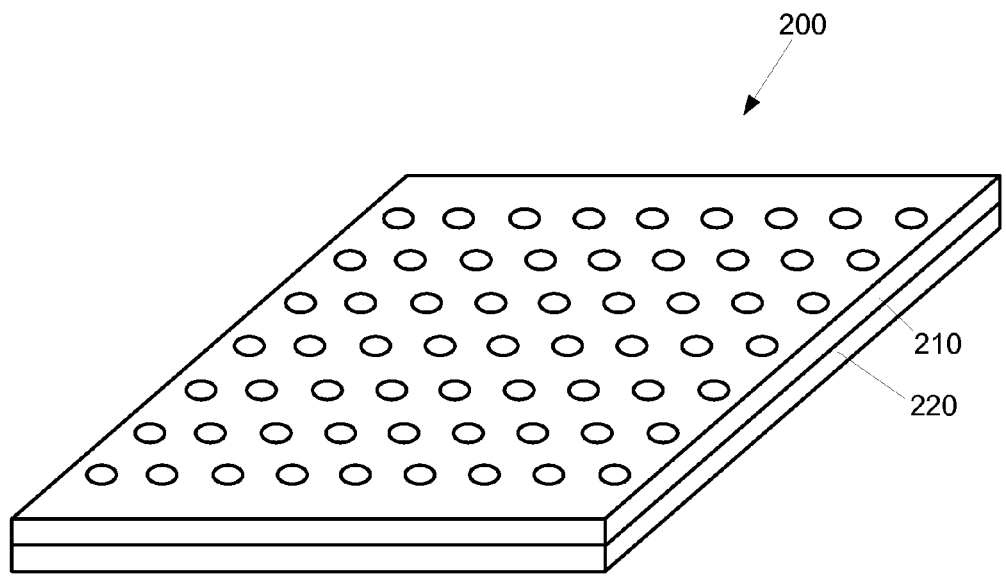
FIG. 6 is a schematic diagram showing panel after bonding a lid plate and a base plate.

Returning to the flowchart of FIG. 4, a step includes forming a lid 210 (FIG. 5) having a plurality of sensor encapsulating covers having transparent members 114 (FIG. 5), wherein the plurality of encapsulating covers are configured to correspond, and once sealed, designed to end up aligned to the plurality of sensor footprints in a one-to-one fashion, as shown by block 440. A step includes aligning each plate such that each respective sensor 150 and optic 114 automatically become aligned correspondingly to one another, as shown by block 450. A step includes bonding the lid plate to the support substrate plate to form a panel, wherein a cavity is formed above each sensor and below each transparent member, as shown by block 460. FIG. 6 shows the sensor panel 200 formed by bonding the substrate plate 210 to the cover plate 220.

Figure 7:
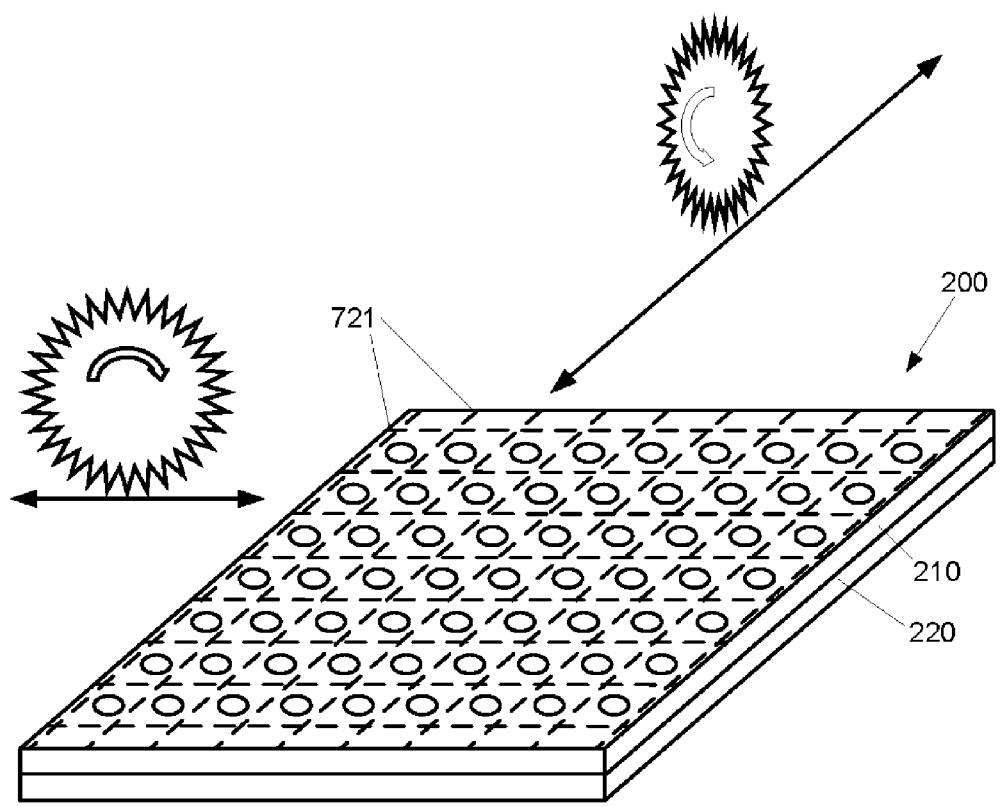
FIG. 7 is a schematic diagram demonstrating one exemplary embodiment of cutting the panel into individual SMT sensor packages.

Returning to the flowchart of FIG. 4, a step includes cutting the panel 200 according to the grid to form a SMT sensor device, as shown by block 470. FIG. 7 shows the sensor panel 200 being sawn according to grid lines. While FIG. 7 depicts the grid lines 721 as dashed lines on the sensor panel 200 for purposes of illustration, there may be no visual indication of the grid lines on the actual surface of the sensor panel. FIG. 7 depicts a substantially rectangular 7 row by 9 column grid of sensors, however, other grid configurations may be used, for example, where there are more rows than columns, or more columns than rows. It should be noted that while FIG. 7 depicts rotary saw blades for illustrative purposes, the cutting step of block 470 is not limited to cutting with a rotary saw, and may be accomplished by other cutting techniques familiar to persons having ordinary skill in the art.

Method for Manufacturing an SMT Sensor Device in a Vacuum Press

A second exemplary method embodiment includes a method of manufacturing an SMT sensor device in a vacuum press. As mentioned previously, an exemplary apparatus and process for iso-thermally sealing electronic packages with a thermosetting adhesive is disclosed by the European Patent Application 91200724.2, entitled "Iso-thermal seal process for electronic devices." Such an apparatus and process may be modified to produce SMT sensor devices of the first embodiment as follows. It is to be understood that the following is one exemplary method, and additional modifications understood by person having ordinary skill in the art are similarly covered by this disclosure.

FIG. 8 is a flowchart of the second method embodiment. A vacuum press is loaded with a printed circuit board (PCB) in the upper half of the press, and a cover plate in the bottom portion of the press, as shown by block 810. A vacuum holds PCB into the upper half of the press. A vacuum may or may not be used to hold the cover plate into the lower half of the press. While it is recommended that the heavier metal/ceramic/plastic cover plate is loaded on lower half of press, there is no objection to loading the cover plate on the upper half of the press and the PCB on the lower half of the press.

The press is closed, as shown by block 820. The active area of the press is purged with a gas, for example, with dry nitrogen gas (N2) or other suitable gas or gas mixture, while heating the active area of the press, for example, to 165 degrees Celsius for one to two minutes. The heating of the active area of the press may soften a bonding agent or adhesive 122 applied to the cover plate and or the PCB. The press makes a seal, for example with an Iso-Thermal Sealing System (ITS) seal, as shown in block 830. The vacuum is released and after a period of time, known as a "pressure on time", the gas purge is relaxed. The press is closed, for example by activating a piston to press the PCB onto the cover plate with a controlled amount of pressure to form an iso-thermal seal between cover and PCB.

The bonding agent is cured by continuing to apply heat to the active area of the press, for example, maintaining the active area at a temperature of 165 C to cure the Bonding agent, as shown by block 840. Once curing is completed, the heating can be switched off to allow the completed panel to cool. The press is opened, as shown in block 850. A finished panel of sensor packages is removed from the press, each package has been sealed iso-thermally, and each is N2 or gas filled. The packages are ready for testing and sawing into individual SMT sensor packages.

In summary, it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process for manufacturing a surface mount technology (SMT) sensor device, comprising the steps of:
   forming a support substrate;
   mapping a grid comprising a plurality of sensor footprints on said substrate;
   affixing a sensor within each said plurality of sensor footprints;
   forming a lid comprising a plurality of sensor encapsulating covers having transparent members, wherein said plurality of encapsulating covers are configured to correspond to said plurality of sensor footprints in a one-to-one fashion;
   aligning said lid to said support substrate;

bonding said lid to said support substrate to form a panel, wherein a cavity is formed above each sensor and below each transparent member; and cutting said panel according to said grid to form an SMT sensor device.

2. The process of claim 1, wherein said sensor is an optical sensor configured to detect wavelengths in the visible spectrum.

3. The process of claim 1, wherein said sensor is an infrared sensor.

4. The process of claim 1, wherein said bonding occurs in a gas controlled environment.

5. The process of claim 1, wherein each of said transparent members comprises a lens.

6. The process of claim 1, wherein each of said transparent members comprises a filter.

7. The process of claim 6, further comprising the step of:
if said sensor fails said test, marking said sensor as defective.

8. The process of claim 7, further comprising the step of:
after said cutting, discarding said SMT sensor if said SMT sensor was marked as defective.

9. The process of claim 1, further comprising the step of testing said sensor.

10. The process of claim 9, wherein said testing occurs prior to said bonding and cutting steps.

11. The process of claim 9, wherein said testing occurs prior to said cutting step.

12. The process of claim 1, further comprising the step of:
introducing a gas into said gas controlled environment, wherein said gas is retained within said cavity after said bonding.

* * * * *